(12) United States Patent
Sadkowski et al.

(10) Patent No.: US 6,229,470 B1
(45) Date of Patent: May 8, 2001

(54) ANALOG CLIPPING CIRCUIT FOR MIXED SIGNAL CODECS

(75) Inventors: Roberto Sadkowski; Steve Yang, both of Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/351,610

(22) Filed: Jul. 12, 1999

Related U.S. Application Data
(60) Provisional application No. 60/094,354, filed on Jul. 28, 1998.

(51) Int. Cl.[7] ............................. H03M 3/00; H03M 1/62
(52) U.S. Cl. ...................... 341/143; 341/143; 341/141; 341/139
(58) Field of Search ..................................... 341/135, 136, 341/139, 141, 155, 143; 327/321, 327, 328

(56) References Cited

U.S. PATENT DOCUMENTS

| | | | |
|---|---|---|---|
| 4,626,707 | * 12/1986 | Arita et al. | 307/355 |
| 5,568,144 | * 10/1996 | Chiao et al. | 341/139 |
| 5,821,889 | * 10/1998 | Miller | 341/139 |
| 5,969,654 | * 10/1999 | Goldin | 341/141 |
| 6,084,467 | * 7/2000 | Muza | 330/69 |
| 6,104,329 | * 8/2000 | Kowano | 341/139 |

* cited by examiner

Primary Examiner—Michael Tokar
Assistant Examiner—V. Tan
(74) Attorney, Agent, or Firm—Alan K. Stewart; Wade James Brady, III; Frederick J. Telecky, Jr.

(57) ABSTRACT

A mixed signal codec includes: a multiplexer amplifier 24 having an analog output signal; a sigma-delta analog to digital converter 26 having an input coupled to the analog output signal; and a clipping circuit 40 and 42 coupled to the input of the analog to digital converter for clipping the analog output signal.

6 Claims, 2 Drawing Sheets

ANALOG CLIPPING CIRCUIT FOR MIXED SIGNAL CODECS

This application claims priority under 35 USC § 119 (e)(1) of provisional application No. 60/094,354 filed Jul. 28, 1998.

FIELD OF THE INVENTION

This invention generally relates to electronic systems and in particular it relates to analog clipping circuits for mixed signal codecs.

BACKGROUND OF THE INVENTION

Most prior art codecs are a combination of analog input and digital output. A sigma-delta analog to digital converter (A/D) is scaled for a maximum output corresponding to the +3dbm0 code of the PCM data. The analog signal corresponding to this digital upscale value is far less than the maximum allowable dynamic range, which usually is limited by the supply range. This fact could potentially overload the A/D and consequently the digital filter. An FCC test, mandatory in the U.S., falls under this category. Once the digital filter overloads, internal clipping mechanisms prevent wrap around of the digital signal, thus creating a digital representation of a trapezoidal signal that contains harmonics with sufficient power to increase the FM modulation depth.

SUMMARY OF THE INVENTION

Generally, and in one form of the invention, the mixed signal codec includes: a multiplexer amplifier having an analog output signal; a sigma-delta analog to digital converter having an input coupled to the analog output signal; and a clipping circuit coupled to the input of the analog to digital converter for clipping the analog output signal.

DETAILED DESCRIPTION OF PREFERRED EMBODIMENTS

Figure 1:
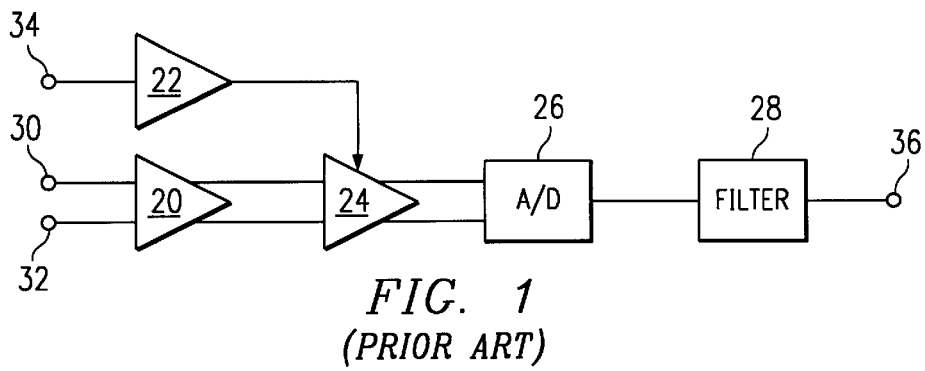
FIG. 1 is a schematic diagram of a prior art codec with analog input and digital output.

Shown in FIG. 1 is a prior art codec with analog input and digital output. The codec of FIG. 1 includes microphone amplifier 20, auxiliary amplifier 22 (for additional microphone), multiplexer amplifier 24, sigma-delta analog to digital converter (A/D) 26, digital filter 28, differential microphone input nodes 30 and 32, single ended microphone input node 34, and digital output node 36.

Figure 2:
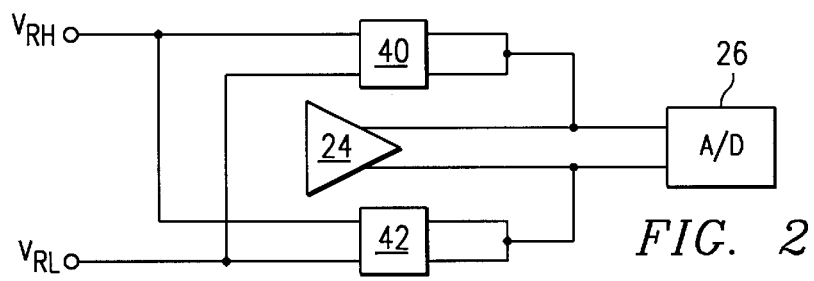
FIG. 2 is a partial schematic diagram of a preferred embodiment codec with analog clipping circuits.

In order to avoid overdriving the sigma-delta A/D 26 of FIG. 1, analog clipping circuits 40 and 42, shown in FIG. 2, are coupled to the differential inputs of the sigma-delta A/D 26 in the preferred embodiment. The analog clipping circuits 40 and 42 add minimum overhead in area and power. For the preferred embodiment, the maximum allowable dynamic range at the input of the sigma delta A/D 26 is a minimum of 0.625 volts and a maximum 2.375 volts. The fully differentiated signal is 3.5 volts (+1.75 volts to −1.75 volts). Each single ended signal is clipped at a low of 0.625 volts ($V_{RL}$) and a high of 2.375 volts ($V_{RH}$).

Figure 3:
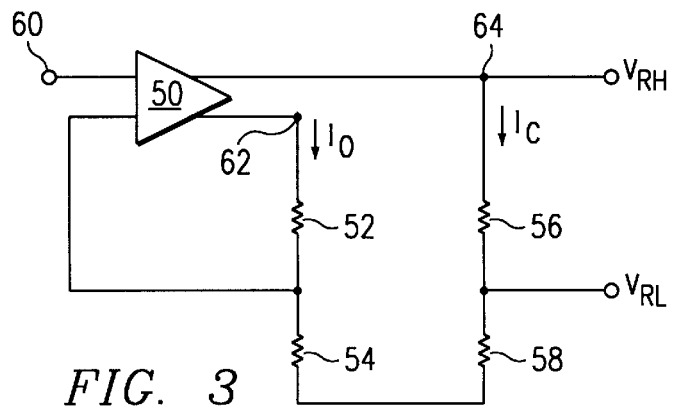
FIG. 3 is a schematic diagram of an output current stage with a reference voltage generator.

To generate the reference voltages $V_{Rh}$ and $V_{RL}$ (0.625 volts and 2.375 volts), the output current stage of the reference system is copied and the current is dropped through a resistor, as shown in FIG. 3. The output current stage of FIG. 3 includes amplifier 50, resistors 52, 54, 56, and 58, input node 60, output nodes 62 and 64, output current $I_O$, copied current $I_C$, and reference clipping voltages $V_{RH}$ and $V_{RL}$. The output current stage of FIG. 3 provides the reference voltages for the sigma-delta A/D 26.

Figure 4:
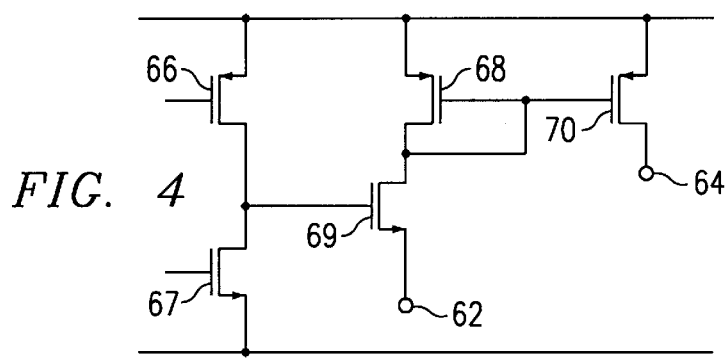
FIG. 4 is a schematic diagram of the output stage of the amplifier of FIG. 3.

The current is copied in amplifier 50 as shown in FIG. 4. The circuit of FIG. 4, which is the output section of amplifier 50, includes transistors 66–70 and output nodes 62 and 64. Transistors 66, 68, and 70 are PMOS transistors. Transistors 67 and 69 are NMOS transistors.

Figure 5:
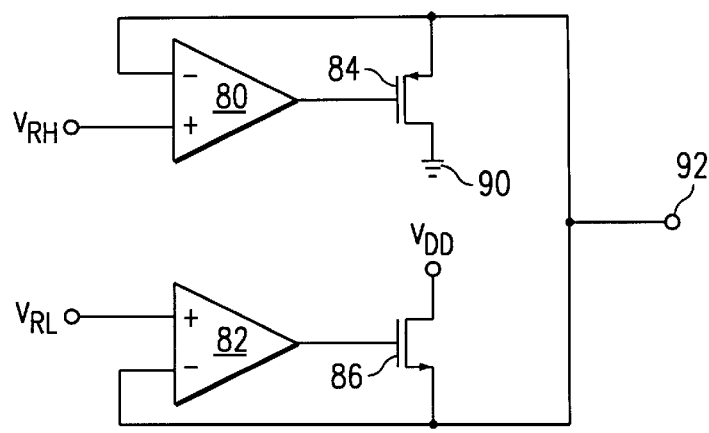
FIG. 5 is a schematic diagram of a preferred embodiment clipping circuit.

A preferred embodiment of the clipping circuits 40 and 42 of FIG. 2 is shown in FIG. 5. The clipping includes comparators 80 and 82, transistors 84 and 86, reference voltage inputs $V_{RH}$ and $V_{RL}$, source voltage $V_{DD}$, ground 90, and output node 92. Transistor 84 is a PMOS transistor. Transistor 86 is an NMOS transistor. The clipping circuit of FIG. 5 consists of comparators 80 and 82 that are normally in stand by. When the voltage on output node 92 moves up to high reference level $V_{RH}$, (upper boundary), comparator 80 switches transistor 84 on. This clips the voltage on output node 92 at high reference level $V_{RH}$. When the voltage on output node 92 moves down to low reference level $V_{RL}$ (lower boundary), comparator 82 switches transistor 86 on. This clips the voltage on output node 92 at low reference level $V_{RL}$. The transistors 84 and 86 are sized so that they will take over the drive of amplifier 24 and dump the current to the rail avoiding local buffering.

When 0.625 v<OUT<2.375 v, both 84 and 86 are off, thus the amplifier is working in the linear region. If OUT>2.375 v, transistor 84 turns on dumping the current of the amplifier 24 and clamping the output level at 2.375. If OUT<0.625 v, transistor 86 turns on and dumps the current to the rail and clamps the output level to 0.625 v. OUT is the voltage at output node 92. $V_{RH}$ is 2.375 volts. $V_{RL}$ is 0.625 volts.

Figure 6:
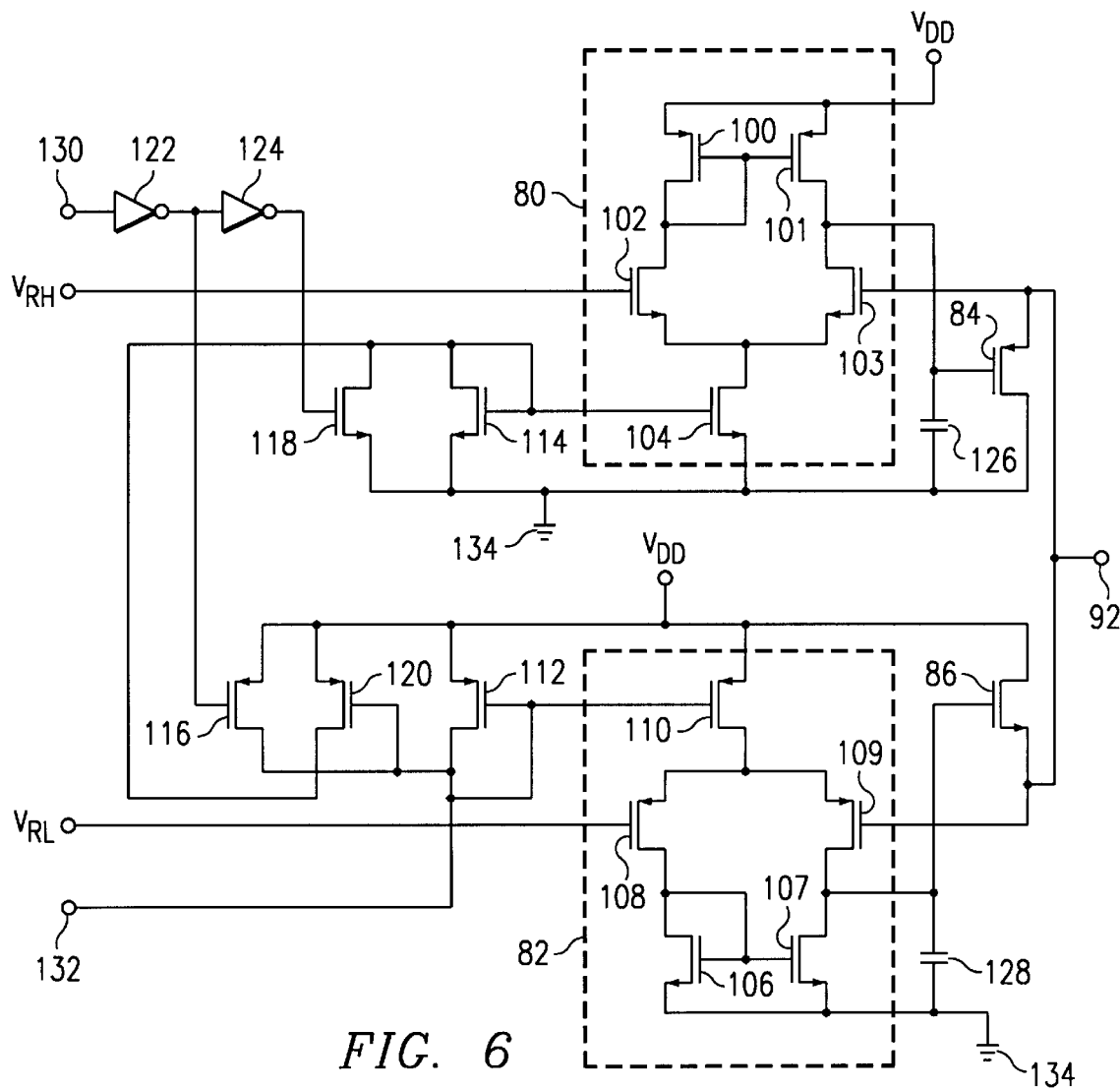
FIG. 6 is a detailed circuit diagram of the clipping circuit of FIG. 5.

A more detailed circuit diagram of the clipping circuit of FIG. 5 is shown in FIG. 6. The clipping circuit of FIG. 6 includes transistors 84 and 86; comparator 80 which includes transistors 100–104; comparator 82 which includes transistors 106–110; transistors 112, 114, 116, 118, and 120; inverters 122 and 124; capacitors 126 and 128; power down node 130; bias current node 132; source voltage $V_{DD}$; ground 134; reference voltages $V_{RH}$ and $V_{RL}$; and output node 92. Transistors 100, 101, 108, 109, 110, 112, 116, and 120 are PMOS transistors. Transistors 102, 103, 104, 106, 107, 114, and 118 are NMOS transistors. Transistors 112, 114, and 120 provide bias currents to the comparators 80 and 82. Transistors 116 and 118 are used to power down the circuit.

Although the present invention has been described in detail, it should be understood that various changes, substitutions and alterations can be made without departing from the spirit and scope of the invention as defined by the appended claims. It is therefore intended that the appended claims encompass any such modifications or embodiments.

What is claimed is:

1. A mixed signal codec comprising:

a multiplexer amplifier having an analog output signal;

a sigma-delta analog to digital converter having an input coupled to the analog output signal; and a clipping circuit coupled to the input of the analog to digital converter for clipping the analog output signal, wherein the clipping circuit comprises a first branch for clipping the output signal at an upper boundary, and a second branch for clipping the output signal at a lower boundary, the first branch comprises:

a comparator having a first input coupled to the input of the analog to digital converter and a second input coupled to an upper boundary reference node; and a transistor coupled between the input of the analog to digital converter and a ground node, and having a control node coupled to an output of the comparator.

2. The device of claim 1 wherein the transistor is a PMOS transistor.

3. The device of claim 2 wherein the first input of the comparator is a negative input and the second input of the comparator is a positive input.

4. A mixed signal codec comprising:

a multiplexer amplifier having an analog output signal;

a sigma-delta analog to digital converter having an input coupled to the analog output signal; and a clipping circuit coupled to the input of the analog to digital converter for clipping the analog output signal, wherein the clipping circuit comprises a first branch for clipping the output signal at an upper boundary, and a second branch for clipping the output signal at a lower boundary, the second branch comprises:

a comparator having a first input coupled to the input of the analog to digital converter and a second input coupled to a lower boundary reference node; and a transistor coupled between the input of the analog to digital converter and a source voltage node, and having a control node coupled to an output of the comparator.

5. The device of claim 4 wherein the transistor is an NMOS transistor.

6. The device of claim 5 wherein the first input of the comparator is a negative input and the second input of the comparator is a positive input.

* * * * *